United States Patent
Yannai et al.

(10) Patent No.: US 6,611,363 B1
(45) Date of Patent: Aug. 26, 2003

(54) SCANNER INCLUDING NEW ZOOM METHOD AND VARIABLE APERTURE

(75) Inventors: Moshe Yannai, Cesaria (IL); Yefim Raizberg, Barkan (IL); Nily Ben-Ami, Ramat-Hasharon (IL); Ornit Band, Rishon Le'Zyon (IL)

(73) Assignee: Creo IL. Ltd., Herzlia (IL)

( * ) Notice: Subject to any disclaimer, the term of this patent is extended or adjusted under 35 U.S.C. 154(b) by 0 days.

(21) Appl. No.: 09/345,871

(22) Filed: Jul. 1, 1999

Related U.S. Application Data

(60) Provisional application No. 60/091,379, filed on Jul. 1, 1998.

(51) Int. Cl.$^7$ .............................. H04N 1/04; H04J 5/16; H01L 27/00; G06K 9/20
(52) U.S. Cl. ..................... 358/475; 358/487; 358/474; 358/497; 250/208.1; 250/234; 250/235; 382/321; 382/323
(58) Field of Search ................................. 358/475, 487, 358/474, 497; 250/208.1, 234, 235; 382/321, 323

(56) References Cited

U.S. PATENT DOCUMENTS

| | | |
|---|---|---|
| 5,325,217 A | 6/1994 | Nagler et al. |
| 5,592,309 A | 1/1997 | Nagler et al. |
| 6,233,063 B1 * | 5/2001 | Bernasconi et al. ........ 358/474 |

* cited by examiner

Primary Examiner—Edward Coles
Assistant Examiner—Houshang Safaipour
(74) Attorney, Agent, or Firm—Eitan, Pearl, Latzer & Cohen Zedek, LLP.

(57) ABSTRACT

In one embodiment, a scanner is provided having inter alia an optical zoom system, which includes a movable lens assembly and a rotatable mirror. The image to be scanned, the optical zoom system and the scanning head are located along an optical axis. The optical resolution of the image is variable by selectively displacing the lens assembly along the optical axis while simultaneously rotating the rotatable mirror about its center. In a further embodiment, a scanner is provided having inter alia a variable aperture for controlling the infiltration of stray light in a scanner having a plurality of optical resolutions.

9 Claims, 7 Drawing Sheets

SCANNER INCLUDING NEW ZOOM METHOD AND VARIABLE APERTURE

CROSS REFERENCE TO RELATED APPLICATIONS

This application claims the benefit of U.S. Provisional Application No. 60/091,379 filed Jul. 1, 1998.

FIELD OF THE INVENTION

The present invention is related to image scanners and in particular to the optical systems of such scanners.

BACKGROUND OF THE INVENTION

Scanners using array-sensors for scanning pictures are well known in the art. In the last few years array-sensor scanners gained popularity and now play a major role in the scanners market.

One feature of array-sensor scanners is the optical resolution, namely the number of samples per unit of length at the picture plane, used to sample the scanned object.

Some scanners provide a single fixed optical resolution, while others provide variable optical resolution. The latter may be divided into two categories, namely scanners that provide a limited number of discrete optical resolutions and scanners that provide a continuous range of optical resolutions.

U.S. Pat. No. 5,325,217 assigned to Scitex Corporation Ltd., Herzlia, Israel, is an example of a scanner with a continuous range of optical resolutions.

In U.S. Pat. No. 5,325,217, the scanned object's position along the optical axis is fixed. The single lens and the Charge Couple Device (CCD) sensor can both move along the optical axis, on linear tracks, powered by two separate motors. By setting the positions of the lens and of the CCD, the optical resolution is adjustable in a continuous fashion.

The principle is similar to that of a traditional photographic enlargement machine. The advantage of this method is that one can set any desired optical resolution, within the limitations of the apparatus. However, in this method, a long optical axis is needed to enable a large range of resolutions, which dictates the size of the scanner and the linear tracks are expensive and difficult to handle.

U.S. Pat. No. 5,592,309 assigned to Scitex Corporation Ltd., Herzlia, Israel is an example of a scanner with discrete resolutions.

In U.S. Pat. No. 5,592,309, the distance between the scanned object and the CCD sensor is constant. The scanner has two lenses of different focal lengths, which are exchangeable. Each one of the lenses is positioned at a different point along the optical axis, dependent on its different focal length, to provide a sharp image on the CCD plane. Thus, each lens provides a different optical resolution.

The advantage of this method is that the fixed distance between the scanned object and the CCD provides for a compact design of the scanner.

The disadvantage of this method is that each optical resolution requires a separate lens, which increases the cost of the scanner.

In single optical resolution scanners, apertures and covers can be used to control stray light infiltration while in multi optical resolution scanners, the geometry of the optical system is different at the various resolutions. Thus, a good design for one geometry will usually interfere with the optical system in another geometry.

SUMMARY OF THE PRESENT INVENTION

It is the purpose of the present invention to provide a mechano-optical design for a scanner that overcomes the aforementioned disadvantages of the prior art multi optical resolution scanners.

In one embodiment of the invention, parts of the linear tracks are replaced by relatively low-cost axial bearing, providing a compact optical system design.

In another embodiment of the invention, a dynamic aperture is provided. The aperture is adjustable to provide optimal stray light control for all optical geometries of the optical system.

Thus, in a preferred embodiment, a scanner is provided having inter alia an optical zoom system, which includes a movable lens assembly and a rotatable mirror. The image to be scanned, the optical zoom system and the scanning head are located along an optical axis. The optical resolution of the image, is variable by selectively displacing the lens assembly along the optical axis while simultaneously rotating the rotatable mirror about its center.

In a further preferred embodiment, a scanner is provided having inter alia a variable aperture for controlling the optical resolution and field of view of the image.

There is thus provided in accordance with a preferred embodiment of the present invention, a scanner for scanning an object. The scanner includes a variable sized aperture for controlling stray light, the variable sized aperture being located proximal to the object.

Furthermore, in accordance with a preferred embodiment of the present invention, the scanner further includes an optical zoom system having a movable lens assembly. The variable sized aperture is located between the object and the movable lens assembly.

Furthermore, in accordance with a preferred embodiment of the present invention, the scanner further includes a light source where the variable sized aperture is located between the object and the light source.

Furthermore, in accordance with a preferred embodiment of the present invention, the size of the aperture is adjusted in accordance with the desired field of view.

Additionally, in accordance with a preferred embodiment of the present invention, the scanner also includes an optical system having an optical bench, a lens and a lens displacement mechanism connected to the optical bench.

Furthermore, in accordance with a preferred embodiment of the present invention, the optical system includes a folding mirror and further includes an adjustment mechanism connected to the optical bench. The adjustment mechanism and the lens displacement mechanism are actuated simultaneously.

Furthermore, in accordance with a preferred embodiment of the present invention, the adjusting mechanism includes first and second slider elements, slidingly interleaved one with the other to provide the variable sized aperture. The field of view of the optical system is proportional to the size of the variable sized aperture.

Additionally, in accordance with a preferred embodiment of the present invention, the lens displacement mechanism includes a linear track fixed to the optical bench, a carriage displaceable along the linear track, the lens being mounted on the carriage; and a lens motor attached to the carriage, the lens motor being operative to cause the carriage to travel along the linear track.

Furthermore, in accordance with a preferred embodiment of the present invention, the variable sized aperture is coupled to the lens motor. The adjustment mechanism includes at least one rod about at least one axial bearing point; and a displacement motor coupled to the at least one rod. The folding mirror is pivotally connected to the at least one rod. On activating the displacement motor, the rod pivots about the axial point thereby to control the angular rotation of the folding mirror.

In addition, in accordance with a further preferred embodiment of the present invention, there is thus provided a scanner for scanning an object, said scanner including at least one array sensor, an optical bench, an optical zoom system comprising a folding mirror; and an adjustment mechanism connected to said optical bench for adjusting the position of said folding mirror.

BRIEF DESCRIPTION OF THE DRAWINGS

The invention is herein described, by way of example only, in reference to the following drawings.

DETAILED DESCRIPTION OF A PREFERRED EMBODIMENT

Figure 1:
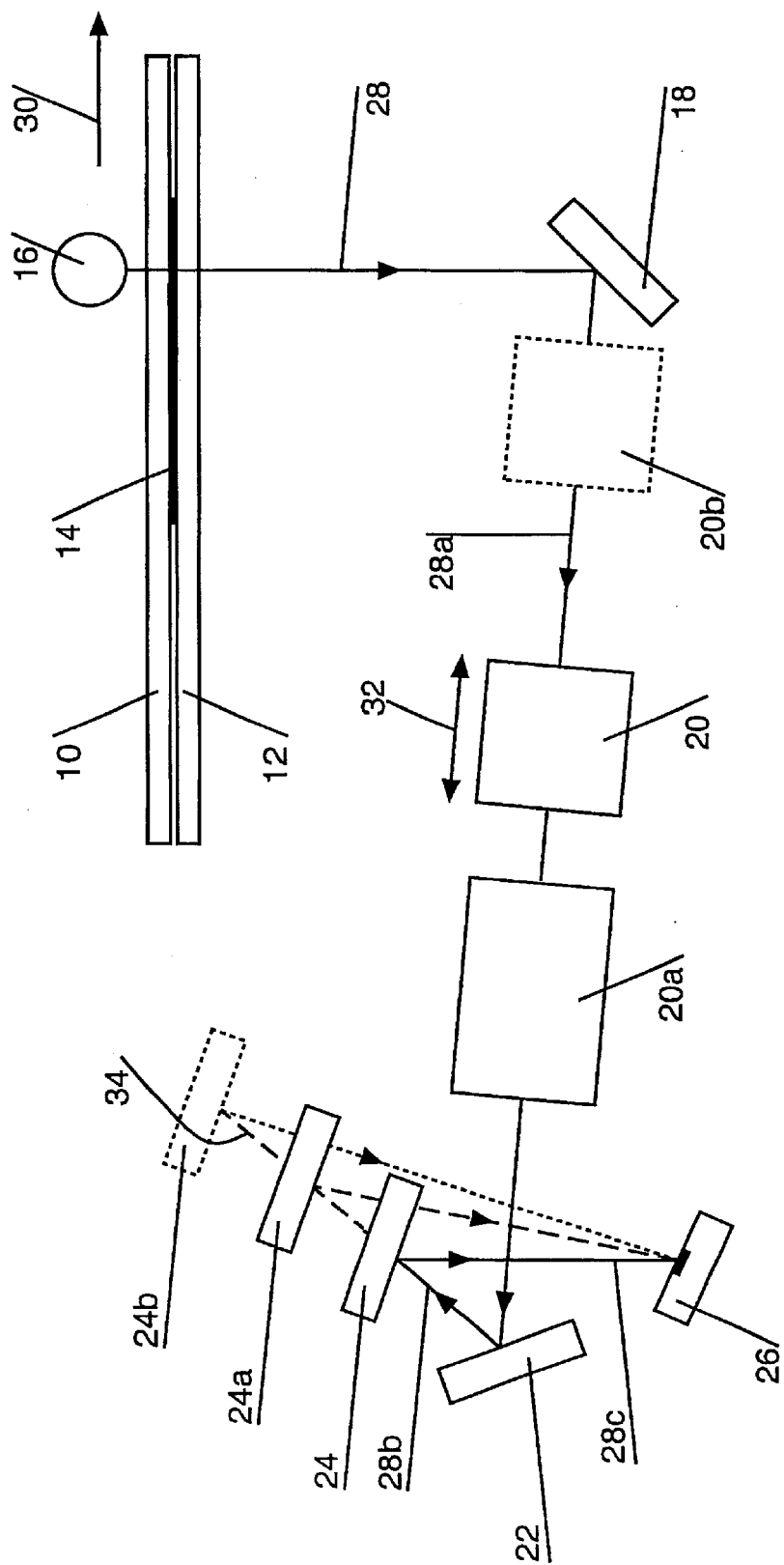
FIG. 1 is a schematic pictorial illustration of the optical features of the scanner constructed and operative in accordance with a preferred embodiment of the present invention.

Reference is made to FIG. 1, which is a schematic pictorial illustration of the optical features of the scanner constructed and operative in accordance with a preferred embodiment of the present invention.

Transparent substrates 10 and 12, of conventional construction, are provided for support of an image, such as a photographic transparency 14, to be scanned. A source of illumination 16, such as a fluorescent tube, is provided for illuminating the transparency 14. The longitudinal axis of fluorescent tube 16 is perpendicular to the transparency 14.

The optical elements comprise a first mirror 18, a lens 20, a second mirror 22 and a rotating mirror 24. Sensor 26, such as a linear CCD array scanning head, arranged in a fixed location along the optical axis 28, is also provided.

Light emitting from fluorescent tube 16 passes through transparency 14 and is directed on to first mirror 18, from whence it is reflected (ray 28a) through lens 20. The light emerging from lens 20 is further reflected by second mirror 22 (ray 28b) onto rotating mirror 24, from which it is further reflected (ray 28c) onto sensor 26.

The optical elements (lens 20, mirrors 18, 22 and 24) and sensor 26 are designed according to known optical rules, so that transparency 14 is imaged onto sensor 26. The transparency 14 is scanned by displacing substrates 10 and 12 along transparency 14 (as shown by arrow 30). As a result, the image of transparency 14 is displaced across sensor 26. Sensor 26 senses the image as it passes through, and samples it line by line.

The optical arrangement shown in FIG. 1 provides a generally compact design, by condensing the optical elements into a compact space and thus, in effect, 'folding' the optical axis 28, as shown, instead of extending it in a straight line.

To provide additional optical resolutions, lens 20 can be displaced, as indicated by arrow 32 to different positions. Two exemplar positions for lens 20 are shown, referenced 20a and 20b, proximate and distal to second mirror 22, respectively. If lens 20 is moved to position 20a, rotating mirror 24 is displaced to a new position indicated by 24a. In the second example, lens 20 is moved to position 20b and rotating mirror 24 is displaced to a position indicated by reference 24b. Each of these alternative positions provides other optical resolutions, which generate images of transparency 14 onto sensor 26, at different optical enlargements. Thus, the image may be scanned at different optical resolutions.

It will be thus be appreciated, that by selecting different positions for lens 20 and rotating mirror 24, a continuously variable optical resolution can be obtained in a compact configuration.

In a preferred embodiment of the invention, rotating mirror 24 is displaced generally along a straight line 34 (an extension of ray 28b) and is rotatable about its center, in a plane parallel to the plane of FIG. 1. By displacing the rotating mirror 24 along line 34, the center of rotating mirror 24 coincides with the optical axis 28 in all positions. The rotation of rotating mirror 24 ensures that the light, reflected from it at each of its positions, is always directed onto sensor 26.

Figure 2B:
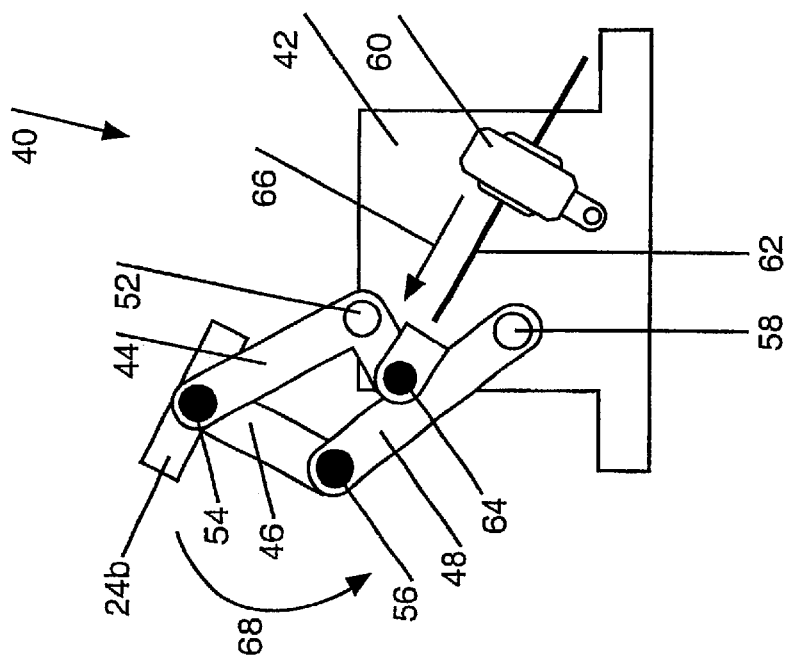
FIGS. 2A and 2B are schematic illustrations of the adjustment mechanism for adjusting the rotating mirror utilized with the scanner of FIG. 1.
Figure 2A:
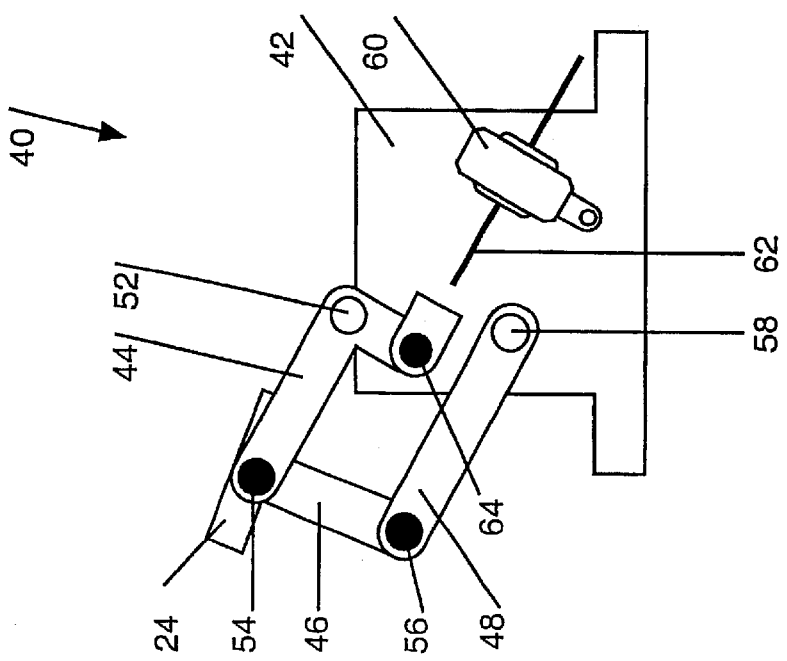
Figure 3:
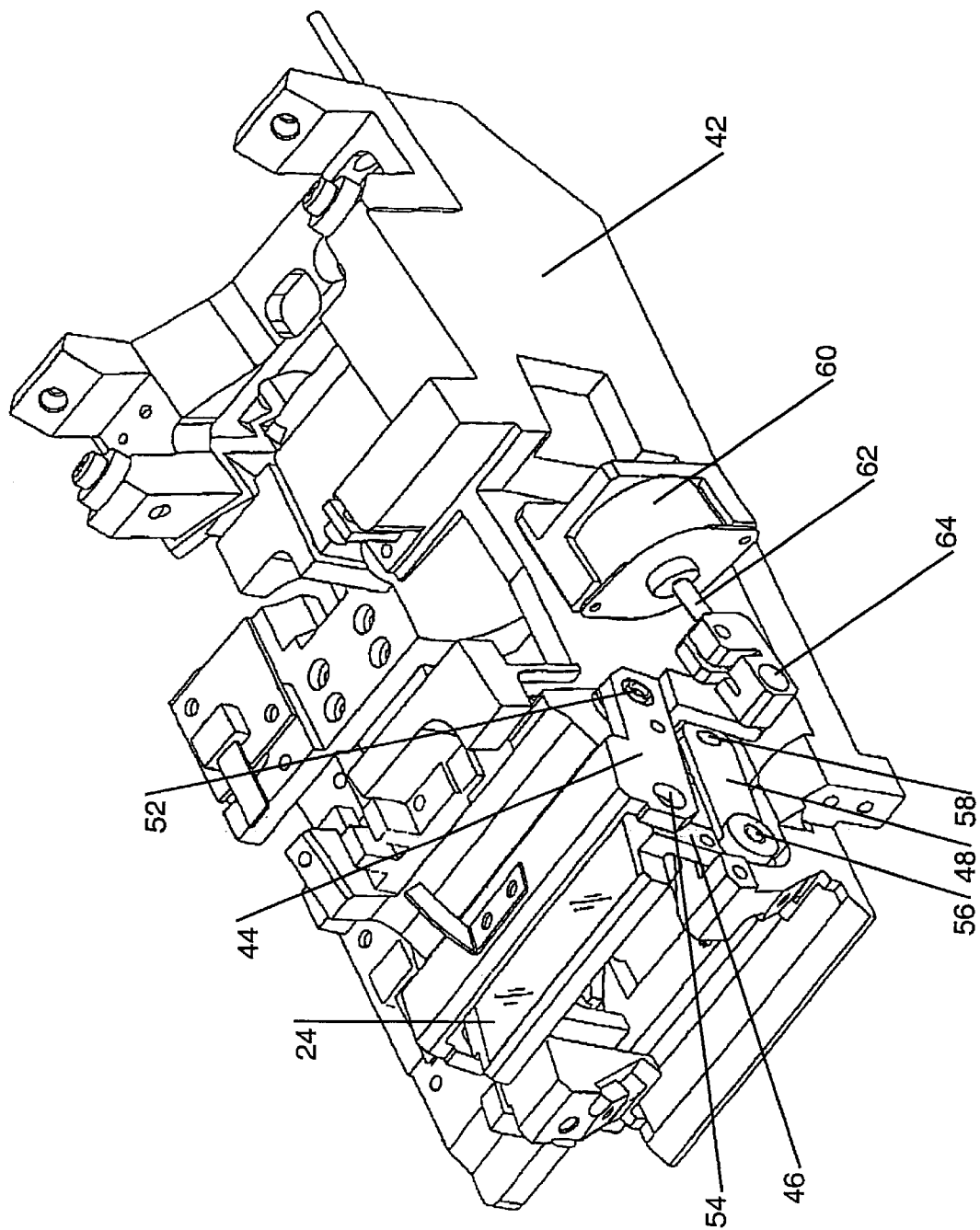
FIG. 3 is an isometric view illustrating the relationship between the adjustment mechanism and the optical elements of the scanner of FIG. 1.
Figure 4:
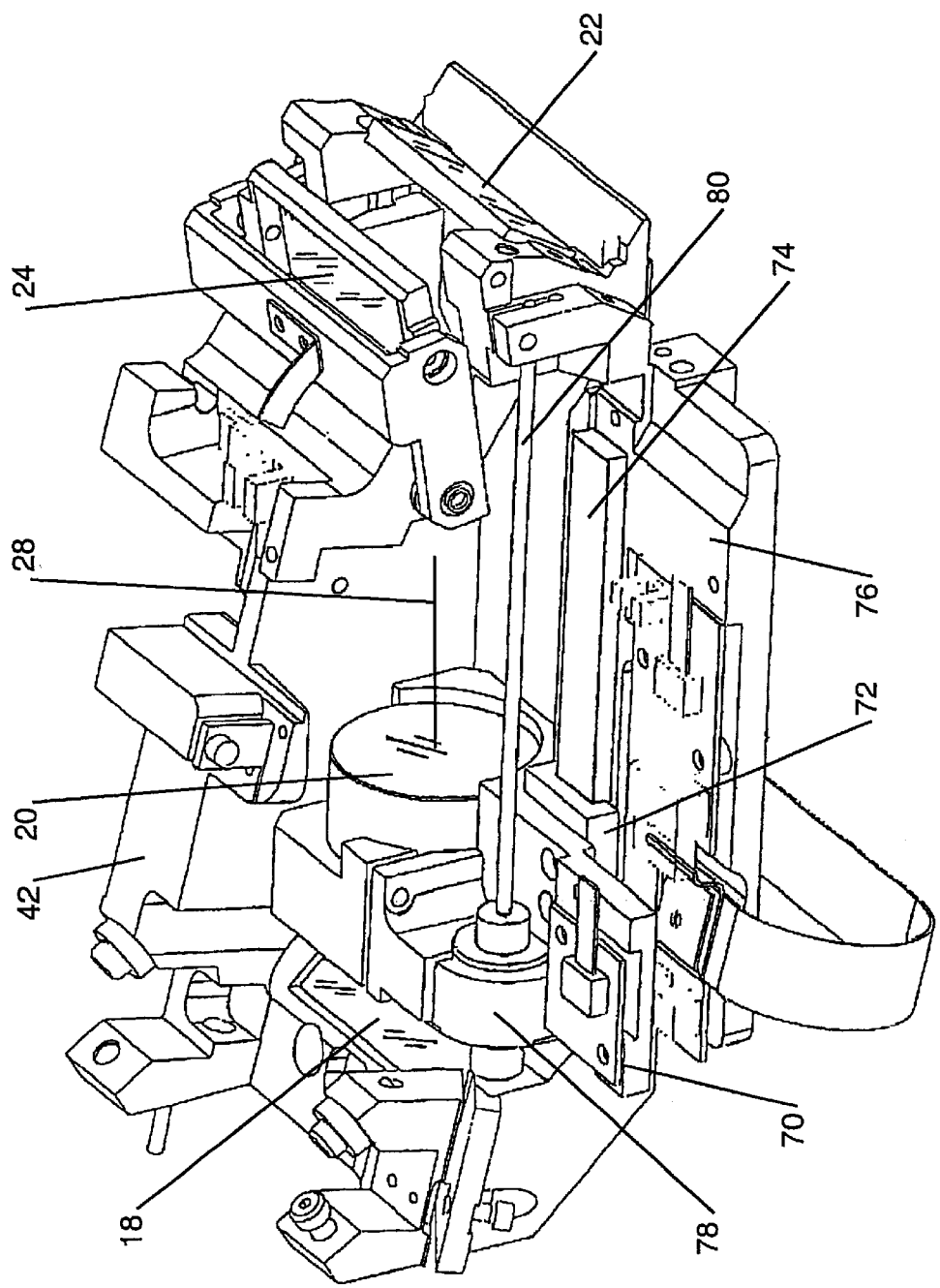
FIG. 4 is an isometric view illustrating the lens displacement mechanism of FIG. 1.

Reference is now made to FIGS. 2A and 2B, which are schematic illustrations of the adjustment mechanism, generally designated 40, for adjusting rotating mirror 24. FIG. 2a illustrates the position of rotating mirror 24 corresponding to the position of lens 20. FIG. 2b illustrates the position referenced 24b of the rotating mirror corresponding to the position of lens 20b. FIGS. 3 and 4 are partial isometric views of the construction of the scanner including the optical elements and adjustment mechanism 40.

The adjustment mechanism 40, which is mounted on an optical bench 42, comprises a plurality of rods, referenced 44, 46 and 48, respectively. First rod 44 is pivotally attached to optical bench 42 about an axial point referenced 52. First and second rods 44 and 46 are pivotally connected to rotating mirror 24 about an axial point 54. Second rod 46 is pivotally connected to third rod 48, about an axial point 56. Third rod 48 is itself pivotally attached to optical bench 42, about an axial point 58. The plurality of rods 44, 46 and 48 pivot about their various pivotal points by axial bearings or similar.

A motor 60 is provided to actuate the adjustment mechanism 40. Motor 60, such as a linear actuator model 36342, manufactured by Haydon Switch and Instrument inc., of Waterbury, Conn., USA is connected to rod 44 about an axial point 64 by a leading screw 62.

FIG. 2b illustrates the movement of the adjustment mechanism 40. Motor 60 drives leading screw 62 in the direction indicated by arrow 66. As a result, first rod 44 rotates clockwise about axial point 52. This in turn displaces rotating mirror 24 upwards, towards position referenced 24b. Second and third rods 46 and 48 respectively control the angular rotation of rotating mirror 24 about axial point 54. The length of second and third rods 46 and 48, respectively and the location of the axial bearing for axial point 58 are configured to provide the desired control of the angular rotation (arrow 68) of rotating mirror 24.

The isometric view shown in FIG. 3 illustrates the relationship between the adjustment mechanism 40 and the optical elements of the scanner. Similar numeric references for similar elements are used in FIGS. 2a, 2b and 3.

Reference is now made to FIG. 4, which is an isometric view of the scanner apparatus of FIG. 3 from the opposite elevation. Elements that are similar to elements that have been previously described are similarly designated.

FIG. 4 illustrates the lens displacement mechanism, generally designated 70, for moving the lens 20 along the optical axis 28. Lens 20 is mounted on a carriage 72, which is displaceable along a linear track 74. Linear track 74 is fixed to the base 76 of the optical bench 42.

A lens motor 78 is provided to actuate the lens displacement mechanism 70. Lens motor 78, which is similar to motor 60, comprises a linear actuator and is suitably connected to carriage 72.

Lens motor 78 is connected to optical bench 42 by a leading screw 80. When lens motor 78 is activated, it travels along leading screw 80. Since lens motor 78 is attached to carriage 72, the actuation of the lens motor 78 causes the carriage 72 and lens 20 connected to carriage 72 to be towed along. Thus, lens 20 can be positioned at any desired position along the optical axis 28.

In an alternative embodiment of the invention, a dynamic aperture is provided to control the stray light conditions and allow for variable optical resolutions.

Figure 5B:
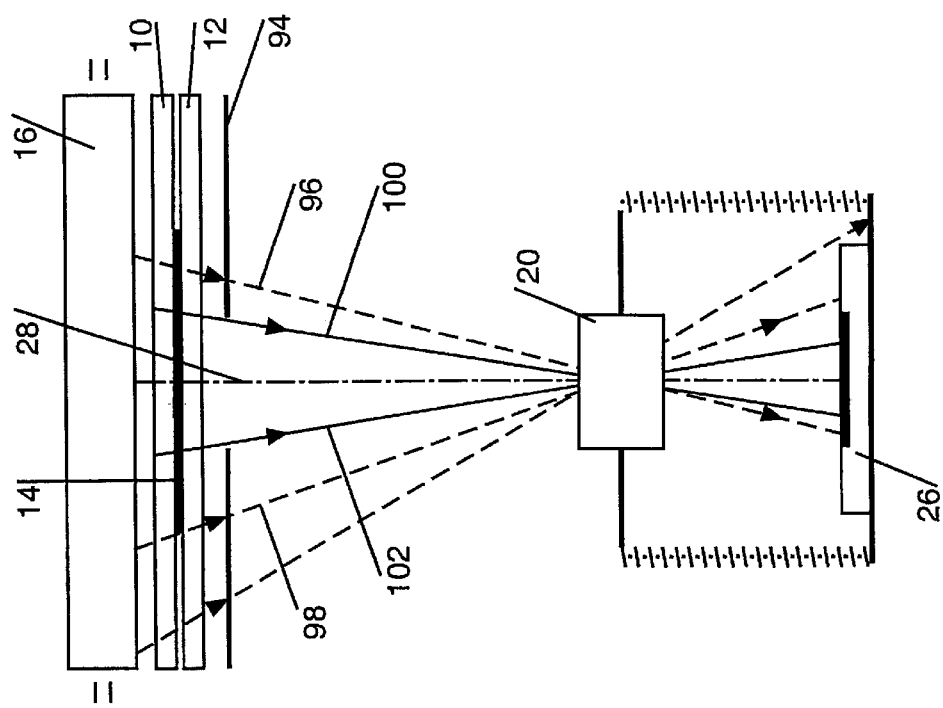
FIGS. 5A and 5B schematically illustrate the scanner of FIG. 1 at relatively high and relatively low optical resolutions, respectively.
Figure 5A:
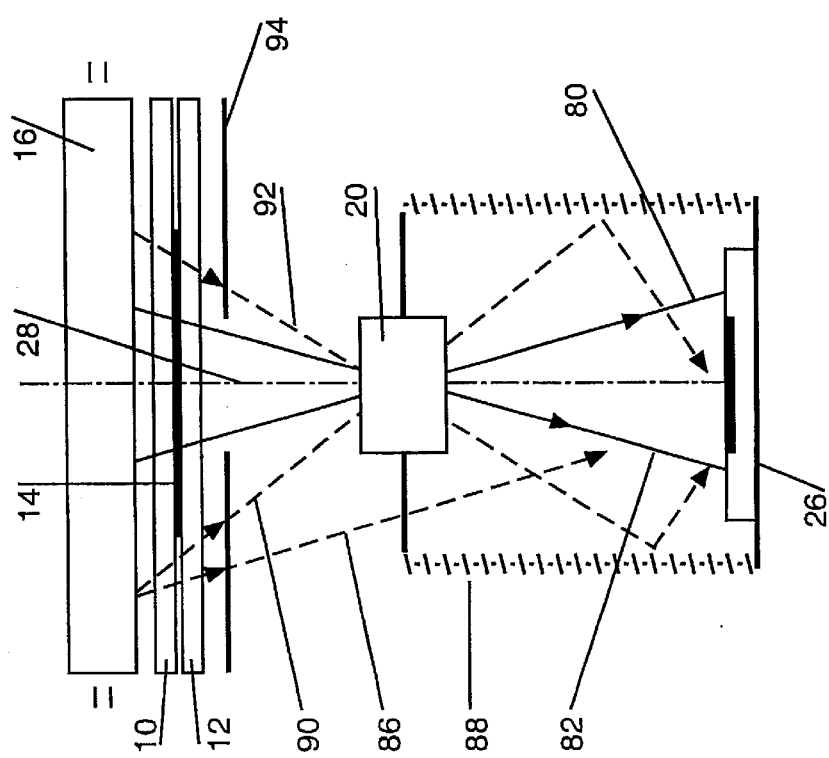

Reference is now made to FIGS. 5A and 5B, which schematically illustrate the scanner at a relatively high and relatively low optical scanning resolutions, respectively. FIGS. 5A and 5B are simplified schematics of FIG. 1 with the mirrors removed. The optical axis 28 is shown "unfolded" and the view is from a direction perpendicular to lamp 16. In other words, the long dimension of the fluorescent tube 16 is parallel to the plane of the FIGS. 5A and 5B.

Referring now to the relatively high-resolution mode of FIG. 5A, the field of view of sensor 26 is indicated by light rays 80 and 82. In this case, all the pixels of sensor 26 are used to sample a relatively small area of transparency 14. Thus, a relatively high optical resolution scanning is provided.

Stray light ray 86 indicates stray light that might reach the sensor 26 via a path that does not traverse lens 20. Commonly, this type of stray light is eliminated by using bellows 88, as shown.

However, stray light, such as light rays 90 and 92, may pass through lens 20, unaffected by the presence of bellows 88, onto sensor 26. To prevent this type of stray light (rays 90 and 92) from reaching sensor 26, an aperture 94 is introduced. Aperture 94 prevents light rays 90 and 92 from penetrating lens 20. Thus, the problem of stray light is controllable.

Reference is now made to the relatively low-resolution mode of FIG. 5B. Moving sensor 26 and lens 20 further way from transparency 14 reduces the optical enlargement and gives a relatively lower sampling resolution compared with FIG. 5A.

Light rays 96 and 98 indicate the desired field of view for efficient use of sensor 26. However, in this case, aperture 94 limits the field of view, as indicated by light rays 100 and 102. This limitation is undesirable and though enlarging the window of aperture 94 will solve the problem, there will be a conflict with the optical requirements illustrated in FIG. 5A hereinabove.

Figure 6:
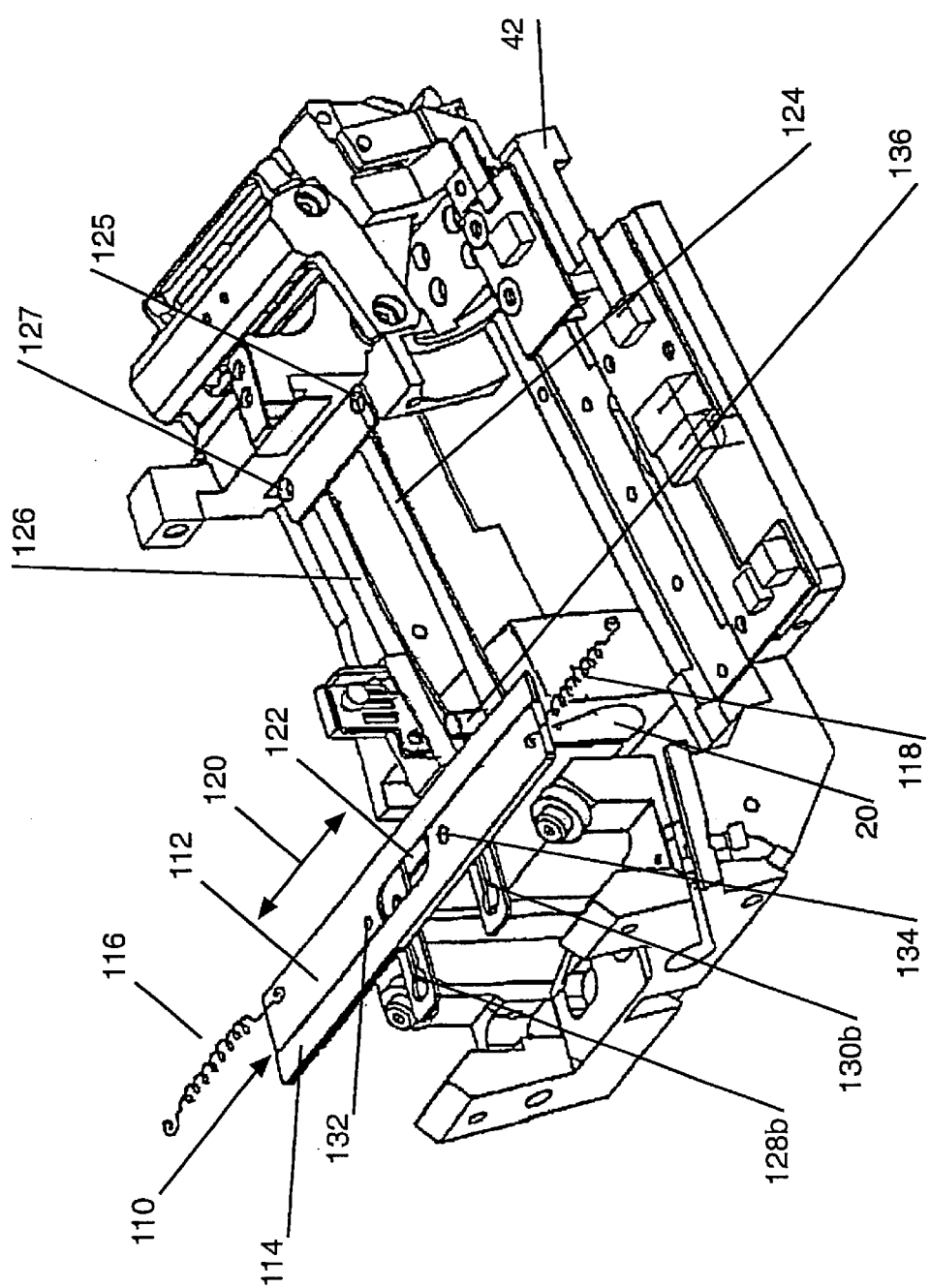
FIGS. 6 and 7 are isometric illustrations of a further preferred embodiment of a scanner constructed and operative in accordance with a preferred embodiment of the present invention.
Figure 7:
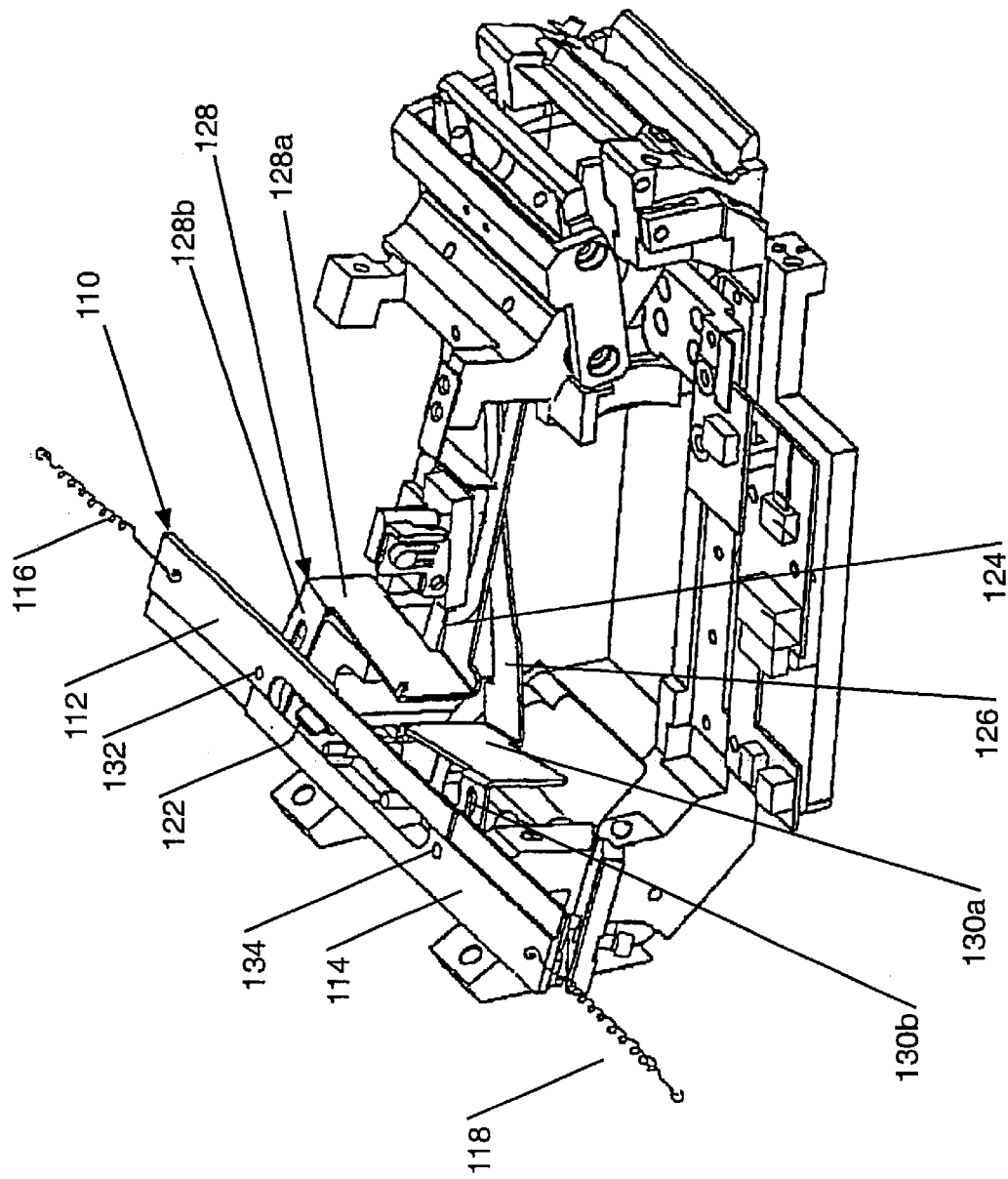

Reference is now made to FIGS. 6 and 7, which are isometric illustrations of a preferred embodiment of the present invention, in which variable aperture means, generally designated 110, is provided. The size of the aperture is adjusted dynamically to an optimal size for both controlling stray light and simultaneously obtaining the maximum field of view.

Variable aperture means 110 comprises first and second slider elements 112 and 114, respectively, slidingly interleaved one with the other. Each of slider elements 112 and 114 is restrainedly secured at one end to optical bench 42 by springs 116 and 118, respectively. Each slider element (112, 114) can move independently as indicated by arrow 120. Thus, when slider 112 is displaced towards spring 116, and slider 114 is displaced towards spring 118, the window opening 122 is increased (as shown in FIG. 7), thereby enlarging the field of view. Thus, the size of aperture 122 can be adjusted to suit the requirements of different optical resolutions.

Variable aperture means 110 further comprises first and second adjustment bars 124 and 126, respectively. One end (distal from slider elements 112 and 114) of first and second adjustment bars 124 and 126, respectively is connected to optical bench 42 by axial bearings 125 and 127, respectively.

As best seen in FIG. 7, the other end (proximate to slider elements 112 and 114) of first and second adjustment bars 124 and 126 comprises "dog-leg" elements, referenced 128 and 130 (not marked on FIG. 7 but symmetric to 128), which are connected to slider elements 112 and 114, respectively.

Dog-leg element 128 comprises a first flat element 128a attached at one end to a second mortised element 128b. Slider element 112 is connected to mortised element 128b by a pin 132 which extends downwards into the slit of mortised element 128b. The other end of mortised element 128b is suitably attached to first adjustment bar 124.

Similarly, dog-leg element 130 comprises a first flat element 130a attached at one end to a second mortised element 130b. Slider element 114 is connected to mortised element 130b by a pin 134 which extends downwards into the slit of mortised element 130b. The other end of mortised element 130b is suitably attached to second adjustment bar 126.

Referring to FIG. 6, a roller 136, located between adjustment bars 124 and 126, is attached to the upper surface of the housing of lens 20.

To obtain a relatively high optical resolution and a small field of view position, lens 20 moves forwards (to the left). Roller 136, attached to the housing of lens 20, moves forwards with lens 20. Since roller 136 is located between adjustment bars 124 and 126, this causes the bars to move apart. Since adjustment bar 124 crosses adjustment bar 126, and since mortised element 128b is a part of adjustment bar 124, the slit within mortised element 128b moves towards the optical axis 28, pulling slider 112 along, against the force introduced by spring 116. The effect of the lens 20 position on slider 114 is similar and symmetrical. Thus, the width of window opening 122 is reduced as required.

Conversely, when lens 20 moves in the opposite direction, for a lower optical resolution and a larger field of view, the process is reversed and the width of window opening 122 is increased, as required.

In an alternative embodiment of the invention, the internal edges of bars 124 and 126 are designed in a shape that provides a perfect match between the mechanical aperture of window 122 and the optical field of view of sensor 26, for each location of lens 20. This design is done by a method of cam and roller, well known in the art.

It will be appreciated by persons skilled in the art, that placing the aperture as close as possible to the object plane, on either side of it, is desirable. When the aperture is very close to the object-plane, the optical image of the edge of the aperture is in focus, and its location is therefore well defined. When, however, the aperture is far from the object-plane, the optical image of the edge of the aperture is out-of-focus, and its location is therefore not well defined.

It will also be appreciated by those skilled in the art, that the variable aperture method described hereinabove is also applicable to two-dimensional sensor arrays. This is particularly useful when a two-dimensional sensor array is used for image capture.

It will be further appreciated by persons skilled in the art that the present invention is not limited by what has been particularly shown and described herein above.

Rather the scope of the invention is defined by the claims that follow:

1. A scanner for scanning an object, said scanner comprising:

at least one array sensor;

an optical bench;

an optical zoom system comprising a folding mirror; and an adjustment mechanism connected to said optical bench for adjusting the position of said folding mirror, said adjustment mechanism comprising at least one rod about at least one axial bearing point, said folding mirror being displaceable about said at least one axial bearing point, wherein said adjustment mechanism simultaneously controls the position and angle of rotation of said folding mirror.

2. A scanner according to claim 1 and further comprising:

a lens; and a lens displacement mechanism connected to said optical bench, for moving said lens along the optical axis of said scanner.

3. A scanner according to claim 2 wherein said adjustment mechanism and said lens displacement mechanism are actuated simultaneously.

4. A scanner according to claim 1 and further comprising a light source directly in line with the optical axis of said zoom system.

5. A scanner according to claim 2 and further comprising a variable sized aperture means for controlling stray light.

6. A scanner according to claim 5 wherein said lens displacement mechanism is coupled to said variable sized aperture means.

7. A scanner according to claim 5 wherein said variable sized aperture means comprises:

first and second slider elements, slidingly interleaved one with the other to provide said variable sized aperture, wherein the field of view of said optical system is proportional to the size of said variable sized aperture.

8. A scanner according to claim 4 and further comprising a variable sized aperture means for controlling stray light.

9. A scanner according to claim 8 wherein said variable sized aperture means is located proximal to said object plane.

* * * * *